(12) United States Patent
Komuro

(10) Patent No.: US 7,183,879 B2
(45) Date of Patent: Feb. 27, 2007

(54) ELECTRIC FILTER, AND DUPLEXER USING THE SAME

(75) Inventor: Eiju Komuro, Chuo-ku (JP)

(73) Assignee: TDK Corporation, Tokyo (JP)

( * ) Notice: Subject to any disclaimer, the term of this patent is extended or adjusted under 35 U.S.C. 154(b) by 147 days.

(21) Appl. No.: 10/995,365

(22) Filed: Nov. 24, 2004

(65) Prior Publication Data

US 2005/0116791 A1 Jun. 2, 2005

(30) Foreign Application Priority Data

Dec. 1, 2003 (JP) .......................... P2003-400991

(51) Int. Cl.
*H03H 9/70* (2006.01)
*H03H 9/54* (2006.01)

(52) U.S. Cl. ...................... 333/133; 333/189

(58) Field of Classification Search ........ 333/187–189, 333/133
See application file for complete search history.

(56) References Cited

U.S. PATENT DOCUMENTS

| | | | |
|---|---|---|---|
| 6,472,954 B1 * | 10/2002 | Ruby et al. ................. | 333/133 |
| 6,870,445 B2 * | 3/2005 | Kawakubo et al. ......... | 333/187 |
| 6,927,649 B2 * | 8/2005 | Metzger et al. ............. | 333/133 |
| 6,936,837 B2 * | 8/2005 | Yamada et al. ............. | 257/2 |
| 6,954,121 B2 * | 10/2005 | Bradley et al. ............. | 333/187 |
| 2005/0073375 A1 * | 4/2005 | Sul et al. .................... | 333/133 |

FOREIGN PATENT DOCUMENTS

JP    A 2001-244704    9/2001

OTHER PUBLICATIONS

Lakin K.M. et al., "Improved Bulk Wave Resonator Coupling Coefficient For Wide Bandwidth Filters"; IEEE 2001 Ultrasonics Symposium; vol. 1, pp. 827-832, Oct. 7-10, 2001.*
Lakin et al., "Thin Film Bulk Acoustic Wave Filters for GPS," Ultrasonics Symposium, pp. 471-476, 1992.
Larson et al., "A BAW Antenna Duplexer for the 1900 MHz PCS Band," IEEE Ultrasonics Symposium, pp. 887-890, 1999.
Ruby et al., "Micromachined Thin Film Bulk Acoustic Resonators," IEEE International Frequency Control Symposium, pp. 135-138, 1994.

* cited by examiner

*Primary Examiner*—Barbara Summons
(74) *Attorney, Agent, or Firm*—Oliff & Berridge, PLC

(57) ABSTRACT

An electric filter according to an embodiment of the present invention is an electric filter having a piezoelectric resonator 10 to obtain a signal of a predetermined resonance frequency from a bulk wave propagating inside a piezoelectric film 15. This electric filter is configured to satisfy $k^2>(BP/0.6f)$, where $k^2$ is the square of an effective electromechanical coupling coefficient of the piezoelectric resonator 10, BP a pass bandwidth of the electric filter, and f a center frequency of a target pass band of the electric filter.

7 Claims, 4 Drawing Sheets

ELECTRIC FILTER, AND DUPLEXER USING THE SAME

BACKGROUND OF THE INVENTION

1. Field of the Invention

The present invention relates to an electric filter and a duplexer using the same and, more particularly, to an electric filter with a piezoelectric resonator using a bulk wave propagating in a piezoelectric film, and a duplexer using the electric filter.

2. Related Background of the Invention

Piezoelectric resonators with advantage for size reduction are used, for example, in duplexers and electric filters mounted on portable, wireless communication devices.

The electric filters in personal communication systems (PCS) using the duplexer are demanded to achieve the pass bandwidth of 60 MHz in the 1.9 GHz band. It is difficult for an electric filter using a conventional piezoelectric to satisfy this specification by itself. There is thus a known band-increasing technology of extending the pass bandwidth by use of an inductor (L), as described in Japanese Patent Application Laid-Open No. 2001-244704.

SUMMARY OF THE INVENTION

However, if the inductor is provided in order to extend the pass bandwidth, the electric filter will increase its size by the degree of the space for the inductor, to lower space efficiency and this will impair the significance of using the piezoelectric resonator for size reduction and also lead to increase of cost.

Where the inductor is used to extend the pass bandwidth, it can deform the waveform of a pass characteristic, so as to negatively affect the characteristics.

An object of the present invention is, therefore, to provide an electric filter and a duplexer capable of achieving a desired pass bandwidth without use of an inductor.

A first electric filter according to the present invention is an electric filter comprising a piezoelectric resonator for obtaining a signal of a predetermined resonance frequency from a bulk wave, wherein the piezoelectric resonator comprises a first electrode; a second electrode placed opposite to the first electrode; and a piezoelectric film disposed between the first electrode and the second electrode, in which the bulk wave propagates. The electric filter satisfies $k^2 > (BP/0.6f)$, where $k^2$ represents the square of an effective electromechanical coupling coefficient of the piezoelectric resonator, BP a target pass bandwidth of the electric filter, and f a center frequency of a target pass band of the electric filter.

In fabrication of an electric filter, there is always a pass bandwidth as a target. In PCS, for example, pass band frequencies of an electric filter for transmission are 1850–1910 MHz (pass bandwidth: 60 MHz), and pass band frequencies of an electric filter for reception are 1930–1990 MHz (pass bandwidth: 60 MHz). In W-CDMA systems, the pass band frequencies of an electric filter for transmission are 1920–1980 MHz (pass bandwidth: 60 MHz), and the pass band frequencies of an electric filter for reception are 2110–2170 MHz (pass bandwidth: 60 MHz). The electric filters are developed so as to satisfy a desired insertion loss in these frequency bands. In various systems (specifications), the required pass band (width) of the electric filters is called a target pass band (width). It is, however, noted that the present invention is applicable not only to specific pass band frequencies, but also to various pass band frequencies.

A second electric filter of the present invention is the aforementioned first electric filter wherein the center frequency f is not less than 1 GHz and wherein the pass bandwidth BP is not less than 1 MHz.

A third electric filter of the present invention is the foregoing first or second electric filter which comprises a plurality of piezoelectric resonators as defined above.

A fourth electric filter of the present invention is the foregoing third electric filter which has a ladder structure, wherein the plurality of piezoelectric resonators include at least one piezoelectric resonator placed on a first wiring portion connecting an input electrode and an output electrode; and a piezoelectric resonator placed on at least one second wiring portion formed between the first wiring portion and an earth electrode, and having a resonance frequency to form the target pass band, together with an antiresonance frequency of the piezoelectric resonator placed on the first wiring portion.

A fifth electric filter of the present invention is any one of the forgoing first to fourth electric filters wherein the piezoelectric film is ZnO or AlN.

A sixth electric filter of the present invention is any one of the foregoing first to fifth electric filters wherein the piezoelectric resonator is an SMR type piezoelectric resonator in which the piezoelectric film and, the first electrode and the second electrode for applying a voltage to the piezoelectric film are formed on an acoustic multilayer film.

A seventh electric filter of the present invention is any one of the foregoing first to sixth electric filters wherein a thickness of the piezoelectric film is not more than 10 μm.

A duplexer according to the present invention comprises a transmitting-end filter comprised of one of the aforementioned first to seventh electric filters and having a predetermined pass frequency band; and a receiving-end filter likewise comprised of one of the aforementioned first to seventh electric filters and having a pass frequency band different from that of the transmitting-end filter.

DESCRIPTION OF THE PREFERRED EMBODIMENTS

The best mode for carrying out the present invention will be described below in further detail with reference to the drawings. The same members will be denoted by the same reference symbols throughout the accompanying drawings, without redundant description. It is noted that the description herein concerns the best mode for carrying out the present invention and that the present invention is by no means intended to be limited to the mode.

Figure 1:
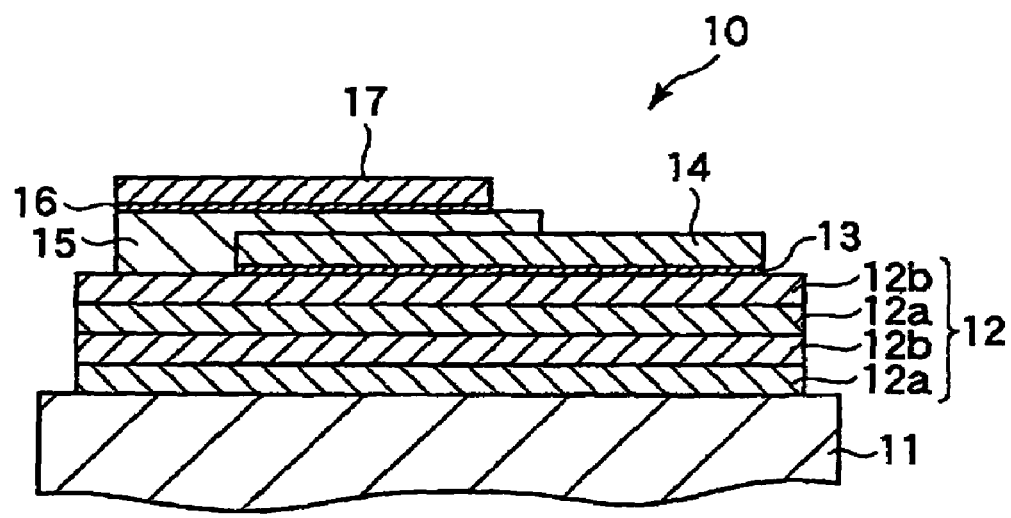
FIG. 1 is a sectional view showing a piezoelectric resonator used in an electric filter in an embodiment of the present invention.
Figure 2:
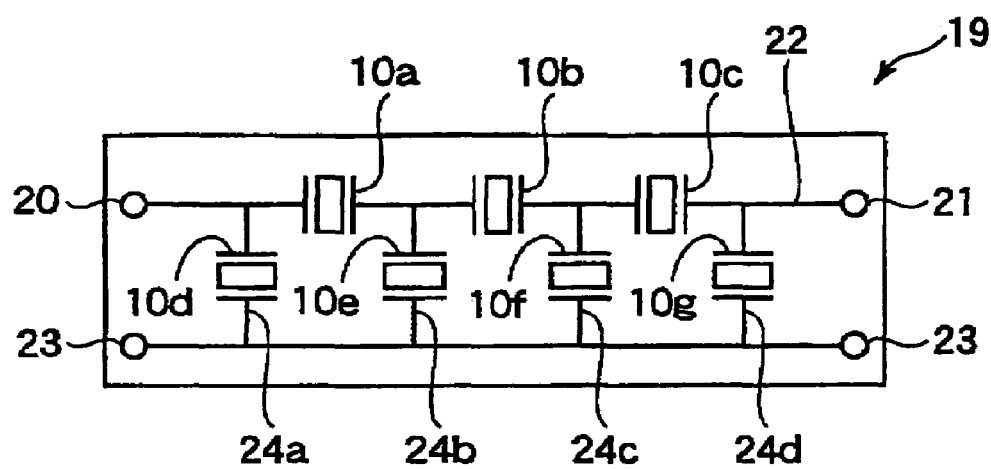
FIG. 2 is a circuit diagram showing an electric filter as an embodiment of the present invention.
Figure 3:
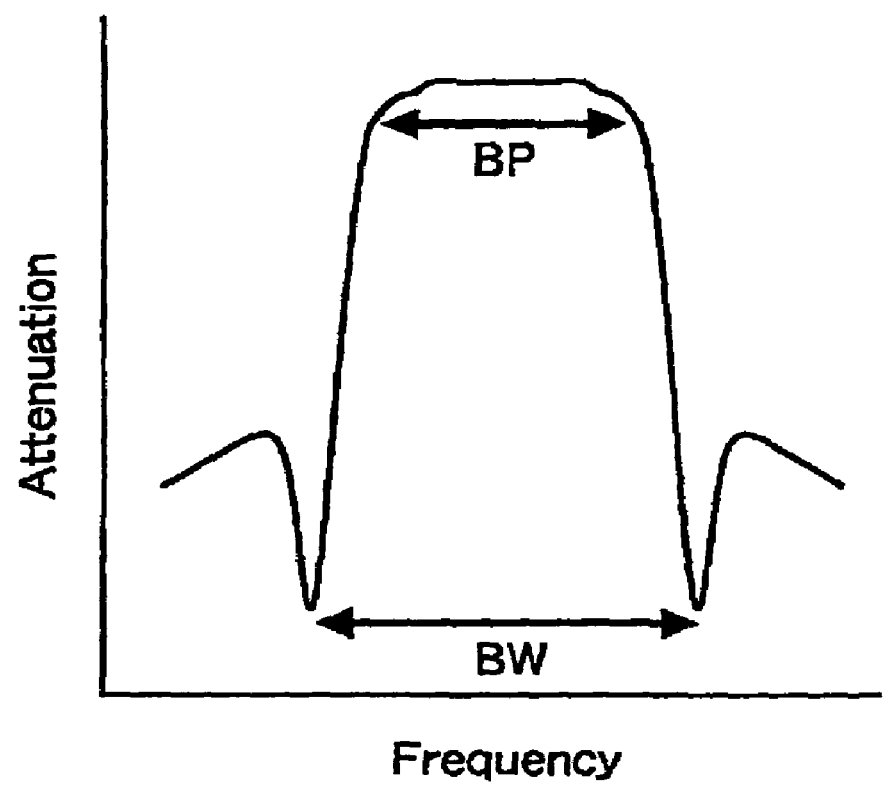
FIG. 3 is a graph showing filter characteristics of the electric filter of FIG. 2.

FIG. 1 is a sectional view showing a piezoelectric resonator used in an electric filter in an embodiment of the present invention, FIG. 2 a circuit diagram showing an electric filter as an embodiment of the present invention, and FIG. 3 a graph showing filter characteristics of the electric filter of FIG. 2.

The piezoelectric resonator 10 shown in FIG. 1 is called an SMR (Solidly Mounted Resonator) type piezoelectric resonator, in which an acoustic reflecting film 12 is formed, for example, on a device substrate 11 of single-crystal silicon. The acoustic reflecting film 12 is comprised of an alternate stack of four layers consisting of thin films with high acoustic impedance and thin films with low acoustic impedance, e.g., AlN films 12a and $SiO_2$ films 12b. A Pt film is deposited through an AlN film as a contact layer 13 on the acoustic reflecting film 12 by vacuum evaporation, to form a lower electrode 14 patterned by lithography.

Furthermore, a piezoelectric film 15 of ZnO or AlN is deposited on the lower electrode (first electrode) 14 by sputtering. The thickness of the piezoelectric film 15 is normally not more than 10 μm and it is thus difficult to fabricate the piezoelectric resonator 10 without the use of the device substrate 11. A hole may be formed in the piezoelectric film 15 by etching or the like to expose the lower electrode 14. An Al film is deposited through a Cr film as a contact layer 16 on the piezoelectric film 15 by sputtering, to form an upper electrode (second electrode) 17 patterned by lithography.

When an ac voltage is applied between the lower electrode 14 and the upper electrode 17, the piezoelectric resonator 10 produces a signal of a predetermined resonance frequency from a bulk wave propagating inside the piezoelectric film 15 by piezoelectric effect.

The acoustic reflecting film 12 does not always have to be formed and, in this case, the lower electrode 14 is formed directly on the device substrate 11. In the present embodiment the acoustic reflecting film 12 consists of the four layers, but is not limited to the four layers if thin films with different acoustic impedances are stacked. Furthermore, the film qualities of the respective thin films are not limited to those described above, and they are just an example.

An electric filter is formed by the layout with such piezoelectric resonators 10. Namely, in an electric filter 19 of the present embodiment, as shown in FIG. 2, a first wiring portion 22 as a serial arm is formed between an input electrode 20 and an output electrode 21, and three piezoelectric resonators 10a, 10b, and 10c are connected in series thereon. In addition, second wiring portions 24a, 24b, 24c, and 24d as parallel arms are formed between an intermediate point between the input electrode 20 and the is piezoelectric resonator 10a, and an earth electrode 23, between an intermediate point between the piezoelectric resonator 10a and the piezoelectric resonator 10b, and the earth electrode 23, between an intermediate point between the piezoelectric resonator 10b and the piezoelectric resonator 10c, and the earth electrode 23, and between an intermediate point between the output electrode 21 and the piezoelectric resonator 10c, and the earth electrode 23, respectively. Piezoelectric resonators 10d, 10e, 10f, and 10g are connected on the respective second wiring portions 24a, 24b, 24c, and 24d. The piezoelectric resonators 10d, 10e, 10f, and 10g have an antiresonance frequency nearly equal to a resonance frequency of the piezoelectric resonators 10a, 10b, and 10c and form a pass band, together with the piezoelectric resonators 10a, 10b, and 10c.

At least one piezoelectric resonator needs to be placed on the first wiring portion 22 as a serial arm. At least one second wiring portion needs to be formed, so that at least one piezoelectric resonator needs to be placed on the parallel arm. Furthermore, the electric filter of the present invention does not have to be limited to the ladder structure as described above, but a variety of structures can be adopted therefor.

Eq (1) below is obtained, where fr represents the resonance frequency of the piezoelectric resonators, fa the antiresonance frequency, and $k^2$ the square of the effective electromechanical coupling coefficient of the piezoelectric resonators.

$$k^2 = (fa/fr)^2 - 1 \quad (1)$$

The effective electromechanical coupling coefficient of a piezoelectric resonator indicates a coupling coefficient of the entire piezoelectric resonator including all the thin films, i.e., the piezoelectric film and the electrode films. An electric filter is often constructed using a plurality of piezoelectric resonators, and the effective electromechanical coupling coefficient of the piezoelectric resonators in this case represents an average of the squares of the effective electromechanical coupling coefficients of these piezoelectric resonators.

By modifying Eq (1) above, Eq (2) below is obtained.

$$\sqrt{k^2+1} = fa/fr \quad (2)$$

By further modifying above Eq (2), Eq (3) below is obtained.

$$fa-fr = (\sqrt{k^2+1}-1)fr \quad (3)$$

The electric filter herein has the filter characteristic as shown in FIG. 3. Then a frequency difference between two attenuation poles is defined as a bandwidth BW, and a pass bandwidth by BP. Supposing the resonance frequency fr of the piezoelectric resonators 10a, 10b, 10c placed on the first wiring portion 22 as a serial arm in the ladder structure as in the present embodiment is equal to the antiresonance frequency fa of the piezoelectric resonators 10d, 10e, 10f, 10g placed on the second wiring portions 24a, 24b, 24c, 24d as parallel arms, Eq (4) below holds.

$$BW = 2(fa-fr) \quad (4)$$

Eq (5) below is obtained from above Eqs (3) and (4).

$$BW = 2fr(\sqrt{k^2+1}-1) \quad (5)$$

Approximation of Eq (6) below holds herein.

$$\sqrt{k^2+1}-1 = (k^2+1)^{1/2}-1 \approx 1+(\tfrac{1}{2})k^2-1 = (\tfrac{1}{2})k^2 \quad (6)$$

Therefore, Eq (7) below is obtained from above Eqs (5) and (6).

$$BW = 2fr \times (\tfrac{1}{2})k^2 = fr k^2 \quad (7)$$

By modifying this Eq (7), Eq (8) below is obtained.

$$k^2 = BW/fr \quad (8)$$

Since the bandwidth BW is the frequency difference between two attenuation poles in the filter characteristics as described above, a constant C is to be determined in order to correlate the bandwidth BW with the pass bandwidth BP.

Here the bandwidth BW, the pass bandwidth BP, and the constant C have the relation of Eq (9) below.

$$BP = BW \times C \quad (9)$$

By substituting above Eq (9) into above Eq (8), Eq (10) below is obtained.

$$k^2 = BP/(fr \times C) \quad (10)$$

The Inventor fabricated eight types of electric filters (duplexers) and evaluated their filter characteristic and temperature characteristic (hereinafter referred to as "TEMP CHRST"). Example 4 is an electric filter of a diaphragm type and all the other examples are filters of the SMR type. The electric filters were fabricated without an inductor for expanding the pass band.

The results are presented in Table 1.

reduction of cost. Since no inductor is used to extend the pass bandwidth, there will be no adverse effect on the filter characteristic due to deformation of the waveform of the pass characteristic.

In Table 1, the electric filters using ZnO for the piezoelectric film are the electric filters satisfying the target pass bandwidth of 60 MHz and satisfying the condition that there is no problem in TEMP CHRST. However, it does not

TABLE 1

| | PIEZOELECTRIC FILM | $K^2$ (%) | TARGET SPECIFICATIONS (ALL WITH THE PASS BANDWIDTH OF 60 MHz) | DETAILS |
|---|---|---|---|---|
| EXAMPLE 1 | ZnO | 5.0 | PCS Tx(I.L.: 3.8 dB) 1850~1910 MHz | PASS BANDWIDTH: 63 MHz, AND TEMP CHRST: ALSO ACCEPTABLE |
| EXAMPLE 2 | ZnO | 5.5 | PCS Tx(I.L.: 3.8 dB) 1850~1910 MHz | PASS BANDWIDTH: 66 MHz, AND TEMP CHRST: ALSO ACCEPTABLE |
| EXAMPLE 3 | ZnO | 4.8 | W-CDMA Rx(3.0 dB) 2110~2170 MHz | PASS BANDWIDTH: 62 MHz, AND TEMP CHRST: ALSO ACCEPTABLE |
| EXAMPLE 4 | ZnO | 4.8 | W-CDMA Rx(3.0 dB) 2110~2170 MHz | PASS BANDWIDTH: 63 MHz, AND TEMP CHRST: ALSO ACCEPTABLE |
| EXAMPLE 5 | AlN | 3.5 | PCS Tx(I.L.: 3.8 dB) 1850~1910 MHz | PASS BANDWIDTH: 46 MHz |
| EXAMPLE 6 | AlN | 4.0 | PCS Tx(I.L.: 3.8 dB) 1850~1910 MHz | PASS BANDWIDTH: 52 MHz |
| EXAMPLE 7 | AlN | 4.0 | W-CDMA Rx(3.0 dB) 2110~2170 MHz | PASS BANDWIDTH: 52 MHz |
| EXAMPLE 8 | ZnO | 4.7 | PCS Tx(I.L.: 3.8 dB) 1850~1910 MHz | PASS BANDWIDTH: 59 MHz |

In Table 1, PCS and W-CDMA indicate names of specifications, Tx the transmitting-end filter, and Rx the receiving-end filter. The effective electromechanical coupling coefficient $k^2$ of the piezoelectric resonators was varied by production methods of the piezoelectric film and the orientation of the lower electrode. In TEMP CHRST, frequency variations were checked in the temperature range of −35 to 85° C. Furthermore, I.L. (insertion loss) was not values 3 dB down from the minimum insertion loss, but was an example of values used as specification values in practice.

From the above results, the electric filters satisfying the target pass bandwidth of 60 MHz and having no problem in TEMP CHRST were Examples 1 to 4. Therefore, the constant C with which Eq 10 holds in the conditions of Examples 1 to 4 and with which Eq 10 does not hold in the conditions of Examples 5 to 8, is 0.6. With this constant, if the left side is greater than the right side in Eq 10, the electric filter will satisfy the target pass bandwidth of 60 MHz and have no problem in TEMP CHRST. Therefore, Eq (11) below is obtained.

$$k^2 > BP/(fr \times 0.6) \quad (11)$$

In Eq (11) above fr represents the resonance frequency, and the resonance frequency is almost equal to the center frequency of the target pass band. Hence, Eq (12) below is obtained using f as the center frequency of the target pass band.

$$k^2 > (BP/0.6f) \quad (12)$$

Accordingly, any electric filter satisfying Eq (12) can achieve a desired target pass bandwidth without the use of an inductor.

This eliminates the need for an inductor and thus a filter can be constructed in compact scale, so as to achieve necessarily imply that the present invention excludes the electric filters using AlN for the piezoelectric film.

Specifically, in the case of Table 1, since the target pass bandwidth to be aimed was set to not less than 60 MHz, AlN to lower the effective electromechanical coupling coefficient merely failed to satisfy the above conditions. On the contrary, the electric filters using AlN for the piezoelectric film can satisfy the both conditions of the target bandwidth and temperature characteristic with different target pass bandwidths. Therefore, the present invention should be construed not to limit the type of the piezoelectric film.

Figure 4:
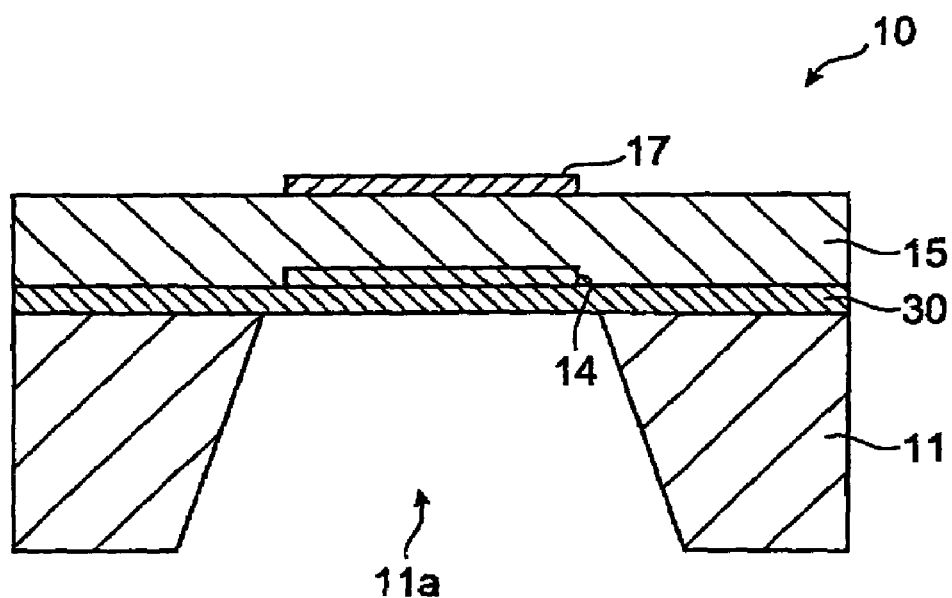
FIG. 4 is a sectional view showing another piezoelectric resonator used in an electric filter in an embodiment of the present invention.

The above described an example of the electric filter of the present invention constructed of the SMR type piezoelectric resonators, but the piezoelectric resonators applicable to the electric filters of the present invention are not limited to the SMR type. FIG. 4 is a sectional view showing another piezoelectric resonator used in an electric filter in an embodiment of the present invention. The diaphragm type piezoelectric resonator 10 shown in FIG. 4 has a device substrate 11, a buffer layer 30, a lower electrode (first electrode) 14, a piezoelectric film 15, and an upper electrode (second electrode) 17. The device substrate 11 is, for example, an Si substrate 300 μm thick. In the diaphragm type piezoelectric resonator 10, the lower electrode 14, piezoelectric film 15, and upper electrode 17 are supported through the buffer layer 30 on one principal surface of the device substrate 11. The piezoelectric film 15 is disposed between the lower electrode 14 and the upper electrode 17 and the thickness thereof is, for example, 1.0 μm. The diaphragm type piezoelectric resonator 10 is provided with an aperture 11a in a region of the device substrate 11 facing the lower electrode 14. As described above, the electric filter of the present invention can use all types of stack type piezoelectric resonators using the piezoelectric film, such as the diaphragm type and air gap type piezoelectric resonators for acoustically totally reflecting the wave, in a state in which the piezoelectric film between the upper and lower electrodes is exposed up and down to the atmosphere.

The present invention is not applicable only to the electric filters, but is also applicable to electronic devices using a plurality of electric filters, e.g., duplexers with one as a transmitting-end filter and another as a receiving-end filter.

As seen from the above description of the preferred embodiments of the present invention, the present invention presents the following effect. Namely, the present invention permits the electric filters and duplexers to have the filter characteristic of the desired target pass bandwidth without the use of an inductor.

What is claimed is:

1. A duplexer comprising:
a transmitting-end filter including an electric filter and having a predetermined pass frequency band; and
a receiving-end filter including the electric filter and having a pass frequency band different from that of the transmitting end filter, wherein the electric filter includes:
a piezoelectric resonator for obtaining a signal of a predetermined resonance frequency from a bulk wave,
wherein the piezoelectric resonator comprises:
a first electrode;
a second electrode placed opposite to the first electrode; and
a piezoelectric film disposed between the first electrode and the second electrode, in which the bulk wave propagates,
the electric filter satisfying $k^2 > (BP/0.6f)$,
where $k^2$ is the square of an effective electromechanical coupling coefficient of the piezoelectric resonator, BP a target pass bandwidth of the electric filter, and f a center frequency of the target pass band of the electric filter.

2. The electric filter according to claim 1, wherein the center frequency f is not less than 1 GHz and wherein the pass bandwidth BP is not less than 1 MHz.

3. The electric filter according to claim 1, comprising a plurality of piezoelectric resonators as defined.

4. The electric filter according to claim 3, having a ladder structure, wherein the plurality of piezoelectric resonators include:
at least one piezoelectric resonator placed on a first wiring portion connecting an input electrode and an output electrode; and
a piezoelectric resonator placed on at least one second wiring portion formed between the first wiring portion and an earth electrode, and having a resonance frequency to form the target pass band, together with an antiresonance frequency of the piezoelectric resonator placed on the first wiring portion.

5. The electric filter according to claim 1, wherein the piezoelectric film is ZnO or AlN.

6. The electric filter according to claim 1, wherein the piezoelectric resonator is an SMR type piezoelectric resonator in which the piezoelectric film and, the first electrode and the second electrode for applying a voltage to the piezoelectric film are formed on an acoustic multiplayer film.

7. The electric filter according to claim 1, wherein a thickness of the piezoelectric film is not more than 10 μm.

* * * * *